(12) United States Patent
Lee et al.

(10) Patent No.: US 12,190,792 B2
(45) Date of Patent: *Jan. 7, 2025

(54) DISPLAY DEVICE

(71) Applicant: LG Display Co., Ltd., Seoul (KR)

(72) Inventors: Junggyu Lee, Gyeonggi-do (KR); JinHo Lim, Gyeonggi-do (KR); Boeun Jo, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/198,416

(22) Filed: May 17, 2023

(65) Prior Publication Data

US 2023/0290302 A1 Sep. 14, 2023

Related U.S. Application Data

(63) Continuation of application No. 17/748,776, filed on May 19, 2022, now Pat. No. 11,694,610, which is a
(Continued)

(30) Foreign Application Priority Data

Sep. 24, 2019 (KR) .................. 10-2019-0117722

(51) Int. Cl.
*G09G 3/32* (2016.01)
*G09G 3/20* (2006.01)

(52) U.S. Cl.
CPC ............ *G09G 3/32* (2013.01); *G09G 3/2003* (2013.01); *G09G 2310/0267* (2013.01); *G09G 2310/0275* (2013.01)

(58) Field of Classification Search
CPC .................. G09G 3/32; G09G 3/2003; G09G 2310/0267; G09G 2310/0275
See application file for complete search history.

(56) References Cited

U.S. PATENT DOCUMENTS 7,935,977 B2 * 5/2011 Lee .................. H10K 71/00
438/43
7,936,977 B2 5/2011 Lee et al.
(Continued)

FOREIGN PATENT DOCUMENTS

CN 103871357 A 6/2014
CN 106814514 A 6/2017
(Continued)

OTHER PUBLICATIONS

U.S. Appl. No. 17/748,776, filed May 19, 2022.
(Continued)

*Primary Examiner* — Amare Mengistu
*Assistant Examiner* — Jennifer L Zubajlo
(74) *Attorney, Agent, or Firm* — Birch, Stewart, Kolasch & Birch, LLP

(57) ABSTRACT

A display device can include a display panel having an active area including a plurality of subpixels; at least one hole area surrounded by the active area; a boundary area between the at least one hole area and the active area; a first gate line on the active area and the boundary area to supply a scan signal to a first group of subpixels; a second gate line on the active area and the boundary area to supply an emission signal to the first group of subpixels. Also, the display device can include a first data line disposed on the active area and the boundary area to supply a first data voltage to a second group of subpixels; and a second data line disposed on the active area and the boundary area to supply a second data voltage to a third group of subpixels.

20 Claims, 11 Drawing Sheets

Related U.S. Application Data continuation of application No. 16/922,453, filed on Jul. 7, 2020, now Pat. No. 11,367,383.

(56) References Cited

U.S. PATENT DOCUMENTS

| | | | | |
|---|---|---|---|---|
| 8,717,523 | B2* | 5/2014 | Lee | G02F 1/1345 |
| | | | | 349/39 |
| 8,947,627 | B2* | 2/2015 | Rappoport | G02B 5/208 |
| | | | | 349/149 |
| 8,994,628 | B2* | 3/2015 | Kang | G09G 3/3648 |
| | | | | 345/87 |
| 9,870,749 | B2* | 1/2018 | Yoo | G09G 3/3688 |
| 9,887,256 | B2* | 2/2018 | Kim | H10K 59/121 |
| 9,905,152 | B2* | 2/2018 | Sang | G09G 3/3607 |
| 10,062,317 | B2* | 8/2018 | Kim | G09G 3/2096 |
| 10,121,452 | B2* | 11/2018 | Shin | H10K 59/123 |
| 10,205,122 | B2* | 2/2019 | Choi | H10K 50/844 |
| 10,276,383 | B2* | 4/2019 | Park | H01L 31/182 |
| 2014/0160172 | A1* | 6/2014 | Lee | G09G 3/3607 |
| | | | | 345/690 |
| 2016/0321977 | A1* | 11/2016 | Kong | G09G 3/2003 |
| 2017/0132963 | A1* | 5/2017 | Zhao | G09G 3/2003 |
| 2017/0154566 | A1* | 6/2017 | Ryoo | H10K 59/131 |
| 2017/0162637 | A1* | 6/2017 | Choi | G09G 3/3225 |
| 2017/0237038 | A1* | 8/2017 | Kim | H10K 77/10 |
| | | | | 257/40 |
| 2017/0294502 | A1* | 10/2017 | Ka | H10K 59/123 |
| 2018/0083072 | A1* | 3/2018 | Kwon | H10K 59/35 |
| 2018/0095583 | A1* | 4/2018 | Kim | G06F 3/0412 |
| 2019/0123066 | A1* | 4/2019 | Zhan | H01L 27/124 |
| 2019/0280076 | A1* | 9/2019 | Bang | H01L 27/124 |
| 2020/0006701 | A1* | 1/2020 | Lee | H10K 59/124 |
| 2020/0236259 | A1* | 7/2020 | Nakamura | G02F 1/133345 |
| 2020/0403050 | A1* | 12/2020 | Seon | H10K 50/84 |
| 2020/0403057 | A1* | 12/2020 | Kang | G09G 3/3233 |

FOREIGN PATENT DOCUMENTS

| | | |
|---|---|---|
| CN | 107039493 A | 8/2017 |
| EP | 3 176 771 A2 | 6/2017 |
| EP | 3296984 A2 | 3/2018 |
| EP | 3 754 711 A1 | 12/2020 |
| EP | 3 754 718 A2 | 12/2020 |
| JP | 2009-218181 A | 9/2009 |
| KR | 10-2018-0049296 A | 5/2018 |
| WO | WO 2018/216545 A1 | 11/2018 |

OTHER PUBLICATIONS

Great Britain Combined Search and Examination Report under Sections 17 and 18(3) for Great Britain Application No. GB2402568. 6, dated Mar. 20, 2024.

* cited by examiner

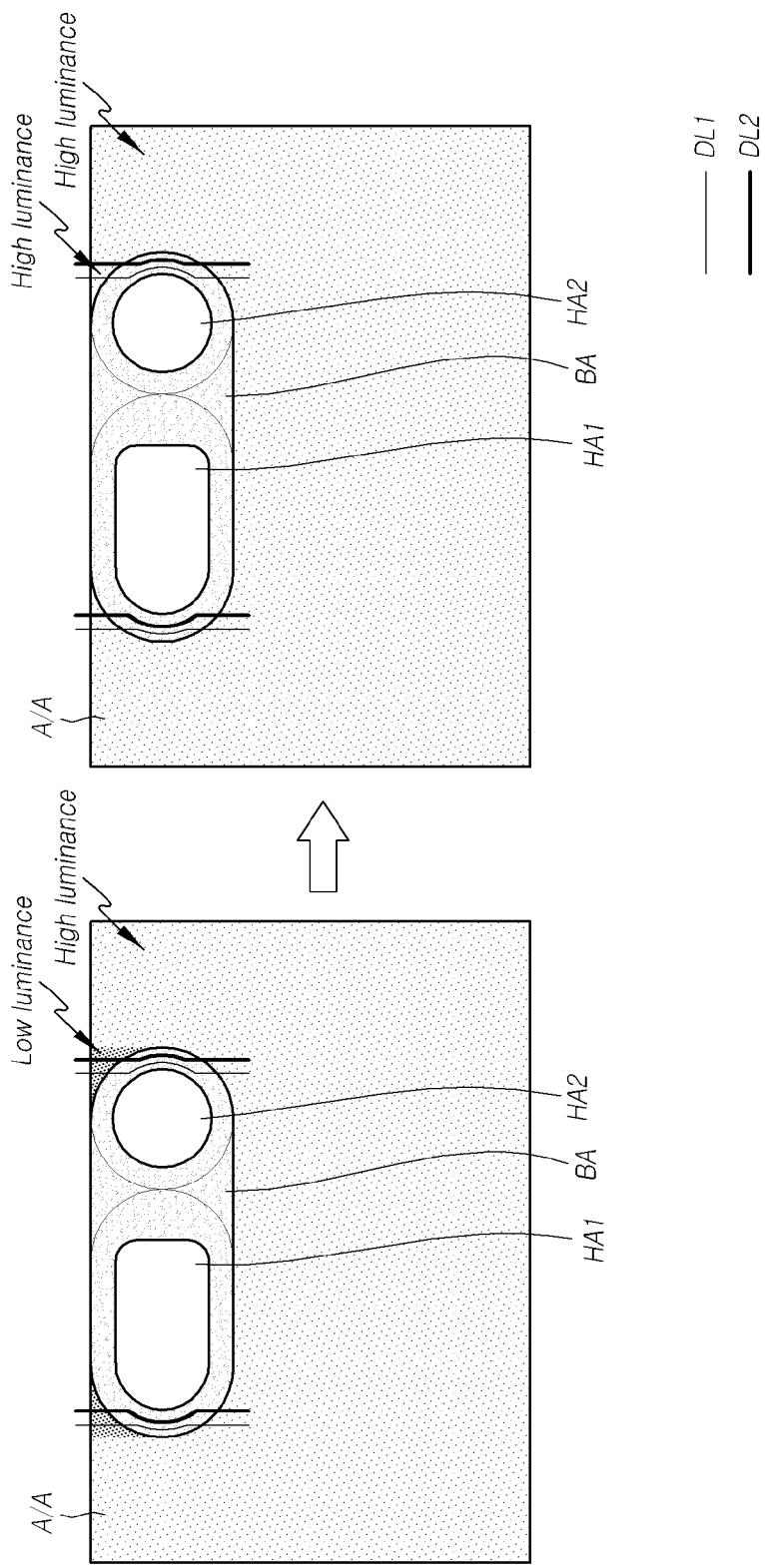

DISPLAY DEVICE

CROSS REFERENCE TO RELATED APPLICATION

This application is a Continuation Application of U.S. patent application Ser. No. 17/748,776 filed on May 19, 2022, which is a Continuation Application of U.S. patent application Ser. No. 16/922,453 filed on Jul. 7, 2020 (now U.S. Pat. No. 11,367,383 issued on Jun. 21, 2022), which claims priority to Korean Patent Application No. 10-2019-0117722, filed in the Republic of Korea on Sep. 24, 2019, where the entire contents of all these applications are hereby expressly incorporated by reference for all purposes as if fully set forth herein into the present application.

BACKGROUND

Field

Embodiments relate to a display device.

Description of Related Art

Along with the development of the information society, demand for a variety of types of image display devices is increasing. In this regard, a range of display devices, such as liquid crystal display (LCD) devices and organic light-emitting diode (OLED) display devices, have come into widespread use.

Such a display device can include a display panel having a plurality of subpixels to display images and a variety of drive circuits to drive the subpixels arranged on the display panel.

In addition, the display device can provide a function of detecting an object approaching the display panel, performing input processing on the basis of detection information, or capturing an image of the object approaching the display panel and displaying the captured image on the display panel.

Therefore, the display device can include sensors, such as a proximity sensor and a camera sensor, depending on the desired function. In addition, such a sensor can be disposed in a bezel area of the display panel, on which no images are displayed.

Alternatively, in some cases, a camera sensor or the like can be located in a portion of an active area of the display panel, on which images are displayed, to prevent the bezel area of the display panel from increasing.

In this case, since a sensor area in which a sensor is disposed is present in an active area in which display operation components, such as signal lines and subpixels, are disposed, it may be difficult to dispose the display operation components in the active area, which can be problematic.

In addition, due to the presence of the sensor area, a structure of signal lines, subpixels, and the like, disposed around the sensor area, can differ from those in the other areas. Accordingly, the presence of a sensor in the active area can degrade the quality of the display panel.

BRIEF SUMMARY OF THE DISCLOSURE

Embodiments of the present invention provide an improved arrangement structure of signal lines including a sensor area provided in an active area of a display panel, the arrangement structure allowing subpixels disposed around the sensor area to be driven.

Embodiments provide a solution able to improve the uniformity of images displayed by the subpixels located in the active area, around the sensor area.

According to an aspect, embodiments can provide a display device including: a display panel in which a plurality of gate lines, a plurality of data lines, and a plurality of subpixels are disposed; at least one hole area located in an active area of the display panel; and a boundary area disposed to be in contact with an outer circumference of the hole area.

In the display device, the plurality of data lines can include: a plurality of first data lines, through which a data voltage is supplied to first color subpixels among the plurality of subpixels, a part of each of the plurality of first data lines being disposed in the boundary area; and a plurality of second data lines, through which the data voltage is supplied to second color subpixels among the plurality of subpixels, a part of each of the plurality of second data lines being disposed in the boundary area, the plurality of second data lines being disposed on a layer different from a layer on which the plurality of first data lines are disposed.

The gate lines can be disposed on a layer different from the layers on which the data lines are disposed. A vertical distance between the second data lines and the gate lines can be greater than a vertical distance between the first data lines and the gate lines.

Here, the first data lines can supply the data voltage to red subpixels and blue subpixels, while the second data lines can supply the data voltage to green subpixels.

According to another aspect, embodiments can provide a display device including: at least one hole area disposed in an active area; a boundary area disposed to be in contact with an outer circumference of the at least one hole area; and a plurality of data lines respectively having a part disposed in the boundary area, at least a portion of the part being curved. Two adjacent data lines among the plurality of data lines can be disposed on different layers According to embodiments, a boundary area can be disposed in an active area of a display panel, outside of a hole area in which camera sensors or the like are disposed, and signal lines for display operation can be disposed in the boundary area, thereby providing an arrangement structure of signal lines, through which subpixels located around the hole area are driven.

In addition, data lines disposed in the boundary area located around the hole area can be disposed on different layers according to subpixels driven through the data lines, thereby reducing an increase in load, which would otherwise be caused by an increase in the length of the data lines disposed in the boundary area.

Accordingly, degradations in luminance that would otherwise be caused by an increase in the load of data lines through which subpixels located around the hole area are driven can be prevented, thereby improving the uniformity of images displayed by subpixels around the hole area.

BRIEF DESCRIPTION OF THE DRAWINGS

The above and other objects, features, and advantages of the present disclosure will be more clearly understood from the following detailed description, taken in conjunction with the accompanying drawings, in which:

FIGS. 10 and 11 illustrate examples in which the uniformity of luminance in the active area is improved by the arrangement structure of the data lines illustrated in FIG. 7.

DETAILED DESCRIPTION OF THE EMBODIMENTS

Figure 1:
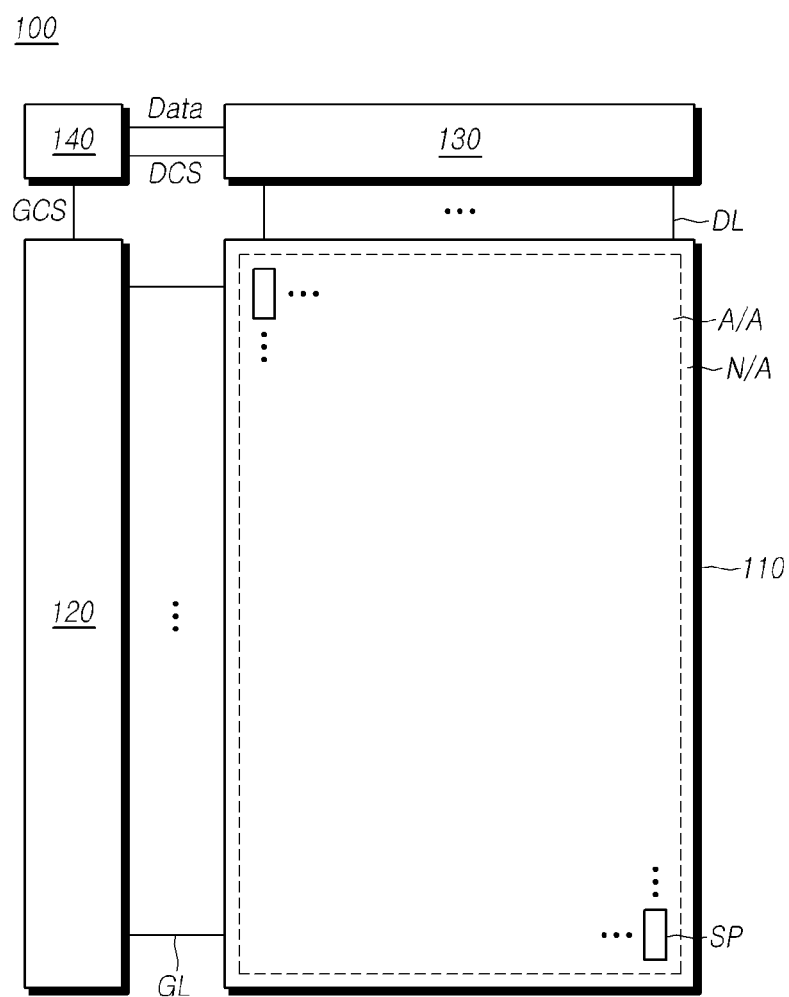
FIG. 1 schematically illustrates a configuration of a display device according to embodiments.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description can make the subject matter in some embodiments of the present invention rather unclear. The teams such as "including", "having", "containing", "constituting" "make up of", and "formed of" used herein are generally intended to allow other components to be added unless the terms are used with the term "only." As used herein, singular forms are intended to include plural forms unless the context clearly indicates otherwise.

Terms, such as "first", "second", "A", "B", "(A)", or "(B)" can be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can."

FIG. 1 schematically illustrates a configuration of a display device 100 according to embodiments. All the components of the display device according to all embodiments of the present invention are operatively coupled and configured.

Referring to FIG. 1, the display device 100 according to embodiments includes a display panel 110 having a plurality of subpixels SP, and a gate driver 120, a data driver 130, a controller 140, and the like for driving the display panel 110.

The display panel 110 can include an active area A/A serving as an image display area, with the plurality of subpixels SP being disposed in the active area A/A, and a non-active area N/A located outside of the active area A/A, with signal lines or the like being disposed in the non-active area N/A.

In the active area A/A of the display panel 110, a plurality of gate lines GL and a plurality of data lines DL are disposed. The subpixels SP can be disposed in areas in which the gate lines GL intersect the data lines DL.

Each of the subpixels SP can include an emitting device ED, and two or more subpixels SP can constitute a single pixel.

The gate driver 120 is controlled by the controller 140, and controls driving times of the plurality of subpixels SP by sequentially outputting a scan signal to the plurality of gate lines GL disposed in the display panel 110.

The gate driver 120 can include one or more gate driver integrated circuits (GDICs), and can be located on one side or both sides of the display panel 110 depending on the driving method.

The data driver 130 receives image data from the controller 140, and converts image data to an analog data voltage Vdata. In addition, the data driver 130 outputs the data voltage Vdata to each of the data lines DL at points in time at which the scan signal is applied through the gate lines GL, so that the subpixels SP exhibit luminous intensities corresponding to the image data.

The data driver 130 can include one or more source driver integrated circuits (SDICs).

The controller 140 supplies a variety of control signals the gate driver 120 and the data driver 130 to control operations of the gate driver 120 and the data driver 130.

The controller 140 controls the gate driver 120 to output the scan signal at points in time defined by frames. The controller 140 converts image data into a data signal format readable by the data driver 130 by receiving the image data from an external source and outputs the converted image data to the data driver 130.

The controller 140 receives a variety of timing signals, in addition to the image data, from an external source (e.g., a host system). The timing signals can include a vertical synchronization signal Vsync, a horizontal synchronization signal Hsync, an input data enable signal DE, a clock signal CLK, and the like.

The controller 140 can generate a variety of control signals in accordance with the variety of timing signals received from the external source and output the control signals to the gate driver 120 and the data driver 130.

For example, the controller 140 outputs a variety of gate control signals GCS, including a gate start pulse GSP, a gate shift clock signal, a gate output enable signal GOE, and the like, to control the gate driver 120.

Here, the gate start pulse GSP controls operation start times of the one or more GDICs of the gate 120. The gate shift clock GSC is a clock signal commonly input to the one or more GDICs to controls shift times of the scan signal. The gate output enable signal GOE designates timing information of the one or more GDICs.

In addition, the controller 140 outputs a variety of data control signals DCS, including a source start pulse SSP, a source sampling clock SSC, a source output enable signal SOE, and the like, to control the data driver 130.

Here, the source start pulse SSP controls data sampling start times of the one or more SDICs of the data driver 130. The source sampling clock SSC is a clock signal that controls sampling times of data in each of the SDICs.

The display device 100 can further include a power management integrated circuit (PMIC) that supplies various forms of voltage or current to the display panel 110, the gate driver 120, the data driver 130, and the like, or controls various types of voltage or current to be supplied thereto.

Voltage lines through which a variety of signals or voltages are supplied, can be disposed on the display panel 110, in addition to the gate lines GL and the data lines DL. An emitting device ED, transistors for driving the emitting device ED, and the like can be disposed in each of the subpixels SP.

Figure 2:
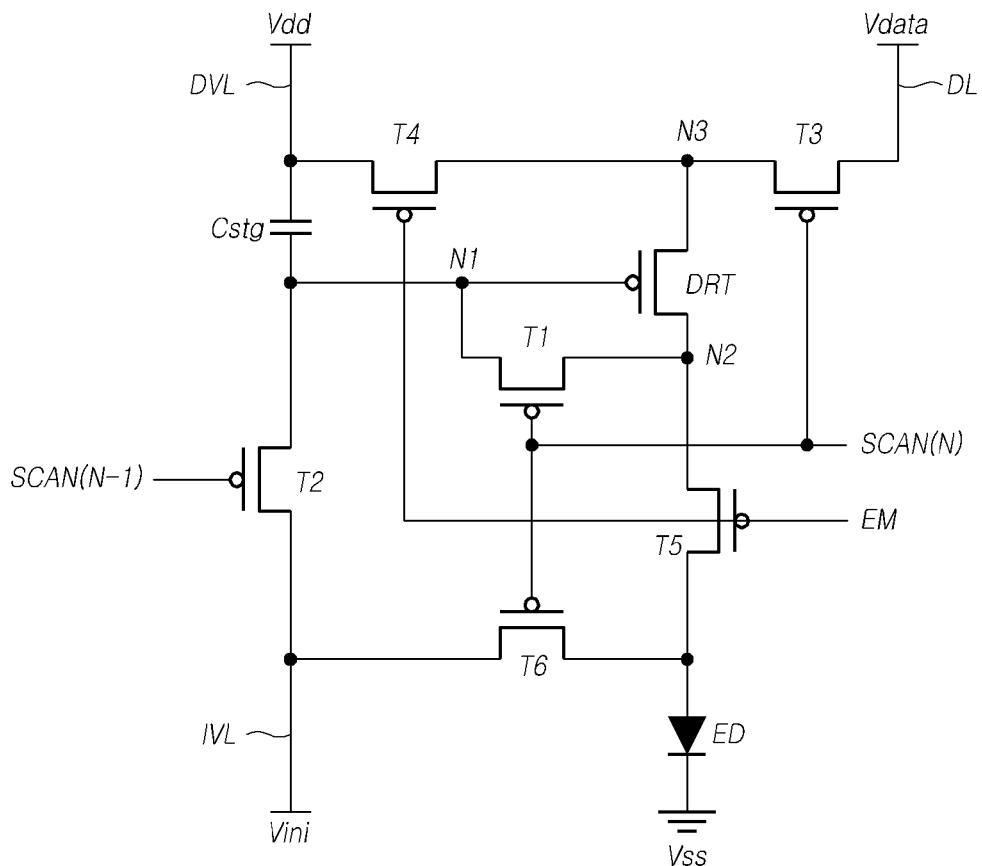
FIG. 2 illustrates a circuit structure of a subpixel (SP) in the display device according to embodiments, as well as driving times of the subpixel.
Figure 2:
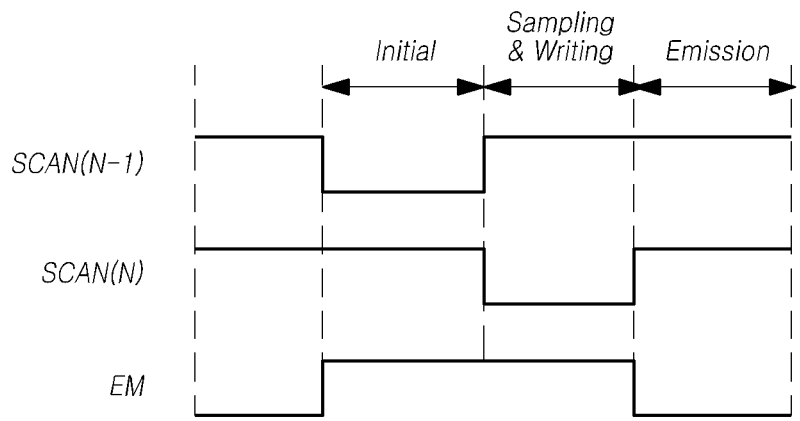

FIG. 2 illustrates a circuit structure of each of the subpixels SP in the display device 100 according to embodiments, as well as driving times of the subpixel SP.

Referring to FIG. 2 which shows an example of each subpixel SP, an emitting device ED can be disposed in the subpixel SP of the display panel 110. In addition, a driving transistor DRT driving the emitting device ED by current control can be disposed in the subpixel SP.

The emitting device ED disposed in the subpixel SP can be an organic light-emitting diode (OLED), and in some cases, can be a light-emitting diode (LED), a micro light-emitting diode (μLED), or the like.

In addition, in the subpixel SP, one or more transistors can be disposed in addition to the driving transistor DRT. A storage capacitor Cstg or the like for maintaining the voltage of the gate node of the driving transistor DRT can also be disposed in the subpixel SP.

FIG. 2 illustrates a 7T1C structure in which seven 7 transistors including the driving transistor DRT and one 1 storage capacitor Cstg are disposed in the subpixel SP. However, the structure of the subpixel SP in the display device 100 according to embodiments is not limited thereto. In addition, although FIG. 2 illustrates the subpixel SP being implemented as a P-type metal-oxide-semiconductor (PMOS) transistor, at least one of the transistors disposed in the subpixel SP can be implemented as an N-type metal-oxide-semiconductor (NMOS).

The emitting device ED can include an anode electrically connected to the driving transistor DRT and a cathode to which a base voltage Vss is supplied.

The driving transistor DRT can electrically connect a driving voltage line DVL through which a driving voltage Vdd is applied and the emitting device ED. In addition, the driving transistor DRT can be electrically connected to a data line DL through which the data voltage Vdata is applied. In addition, the gate node of the driving transistor DRT can be electrically connected to the storage capacitor Cstg and an initialization voltage line IVL.

A first transistor T1 can be controlled by a scan signal SCAN(N) and be electrically connect a first node N1 and a second node N2 of the driving transistor DRT. The first transistor T1 can control a voltage obtained by compensating for the data voltage Vdata with a threshold voltage Vth of the driving transistor DRT to be applied to the gate node of the driving transistor DRT.

A second transistor T2 can be controlled by a scan signal SCANt(N-1) and electrically connect the first node N1 of the driving transistor DRT and the initialization voltage line IVL. The second transistor T2 can be used to initialize the voltage of the gate node of the driving transistor DRT.

A third transistor T3 can be controlled by the scan signal SCAN(N) and electrically connect a third node N3 of the driving transistor DRT and the data line DL. In addition, a fourth transistor T4 can be controlled by a scan signal EM and electrically connect the third node N3 of the driving transistor DRT and the driving voltage line DVL.

A fifth transistor T5 can be controlled by the scan signal EM and electrically connect the second node N2 of the driving transistor DRT and the emitting device ED. The fifth transistor T5 can control emission times of the emitting device ED.

A sixth transistor T6 can be controlled by the scan signal SCAN(N) and electrically connect the anode of the emitting device ED and the initialization voltage line IVL. The sixth transistor T6 can be used to initialize the voltage of the anode of the emitting device ED.

Describing the driving method of the subpixel SP, the subpixel SP can be driven such that the driving period thereof is divided into an initialization period, a data writing period, and an emission period during a single image frame period.

During the initialization period, the scan signal SCAN(N-1) having a low level can be supplied to the subpixel SP, thereby turning the second transistor T2 on. As the second transistor T2 is turned on, an initialization voltage Vini can be applied to the gate node of the driving transistor DRT.

After the completion of the initialization, during the data writing period, the scan signal SCAN(N-1) having a high level and the scan signal SCAN(N) having a low level can be supplied to the subpixel SP. In addition, the second transistor T2 can be turned off, while the first transistor T1, the third transistor T3, and the sixth transistor T6 can be turned on.

As the first transistor T1 is turned on, the first node N1 and the second node N2 of the driving transistor DRT are electrically connected.

In addition, as the third transistor T3 is turned on, the data voltage Vdata can be applied to the first node N1, the gate node, of the driving transistor DRT through the driving transistor DRT and the first transistor T1. At this time, the voltage obtained by reflecting the threshold voltage Vth of the driving transistor DRT to the data voltage Vdata can be applied to the gate node of the driving transistor DRT, so that a compensation for the threshold voltage of the driving transistor DRT can be performed.

In addition, as the sixth transistor T6 is turned on during the data writing period, the anode of the emitting device ED can be initialized by the initialization voltage Vini. For example, both an operation of applying a voltage to the gate node of the driving transistor DRT and an operation of initializing the anode of the emitting device ED can be simultaneously performed during the data writing period.

During an emission period, the scan signal SCAN(N-1) having a high level and the scan signal SCAN(N) having a high level can be supplied to the subpixel SP, and the scan signal EM having a low level can be supplied to the subpixel SP. Consequently, the first transistor T1, the third transistor T3, and the sixth transistor T6 can be turned off, while the fourth transistor T4 and the fifth transistor T5 can be turned on.

As the fourth transistor T4 is turned on, the driving voltage Vdd can be supplied to the third node N3 of the driving transistor DRT, and a difference in the voltage between the first node N1 and the third node N3 of the driving transistor DRT can be created by the data voltage Vdata and the driving voltage Vdd, so that a current in response to the data voltage Vdata can flow through the driving transistor DRT.

As the fifth transistor T5 is turned on, the current in response to the data voltage Vdata can be supplied to the emitting device ED, and the emitting device ED can exhibit a luminous intensity corresponding to the data voltage Vdata.

In addition, the display device 100 according to embodiments can include an area for sensors, such as a camera sensor, in the active area A/A of the display panel 110, in which the above-described subpixels SP are disposed.

For example, none of the subpixels SP can be disposed in an area of the active area A/A of the display panel 110. In addition, the area in which none of the subpixels SP are disposed can be open, such that sensors, such as a camera sensor, can be disposed in the open area. For example, a hole area HA can be provided in the active area A/A, and sensors can be disposed in the hole area HA.

In this case, in a process of disposing display operation components, such as electrodes or signal lines, no display operation configurations can be disposed in the corresponding area. For example, the electrodes, the signal lines, and the like can be disposed in the active area A/A such that images are displayed on the active area A/A except for a portion of the active area A/A in which the hole area HA is to be provided.

Since the hole area HA is provided in the portion of the active area A/A and sensors are disposed in the hole area HA, it is possible to prevent the width of the entire non-active area N/A of the display panel 110 from being increased by the disposition of the sensors.

Figure 3:
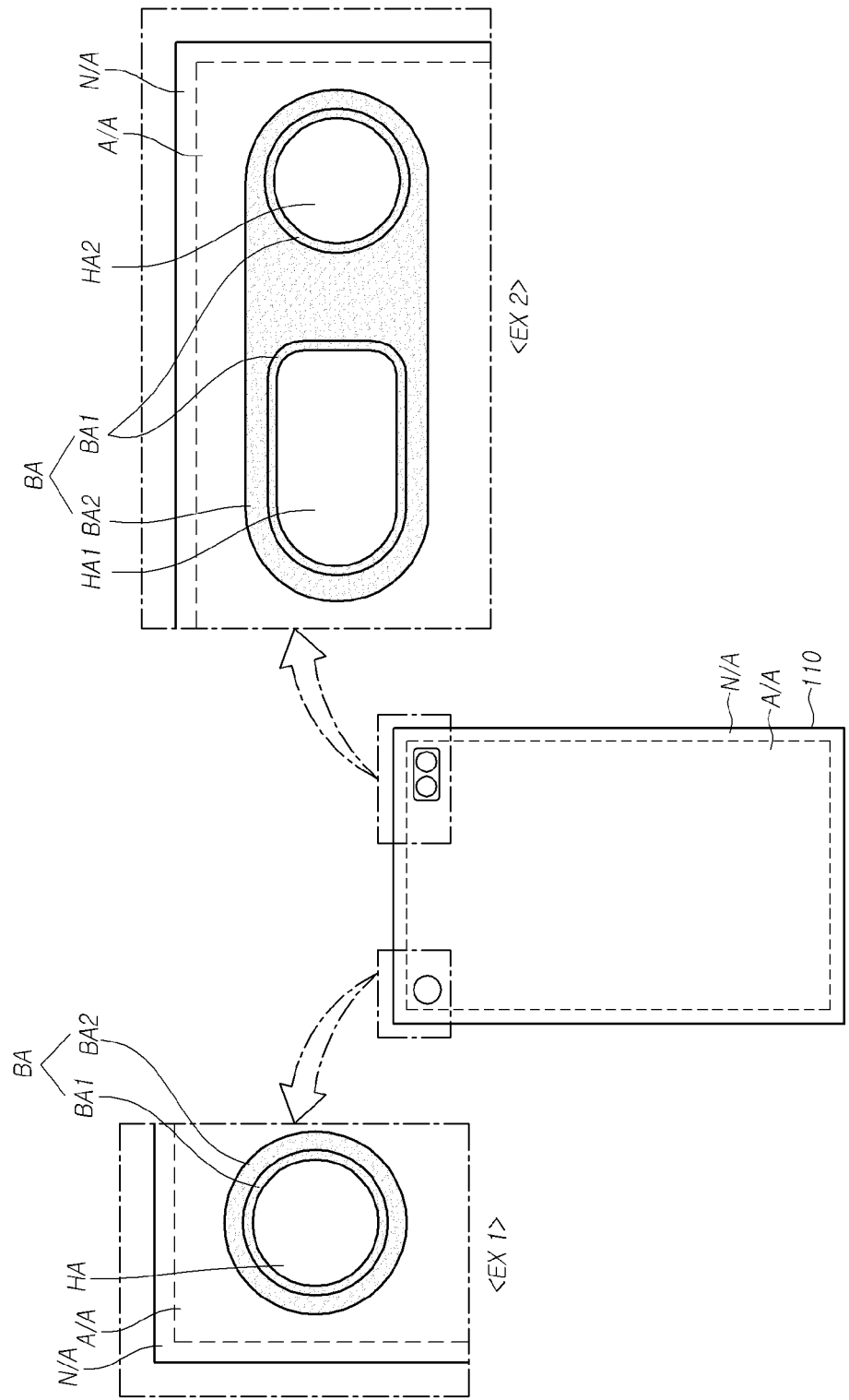
FIG. 3 illustrates structures in which a hole area is provided in an active area of the display device according to embodiments.

FIG. 3 illustrates structures in which the hole area HA is disposed in the active area A/A of the display device 100 according to embodiments.

Referring to FIG. 3, a portion of the active area A/A of the display panel 110 can be the hole area HA in which camera sensors or the like are disposed. In addition, a boundary area BA can be provided around the hole areas HA.

The boundary area BA can be in contact with the outer circumference of the hole area HA and be located between the hole area HA and a portion of the active area A/A in which the subpixels SP are disposed.

The boundary area BA can include a first boundary area BA1 in which signal lines for driving a camera sensor or the like disposed in the hole area HA are disposed and a second boundary area BA2 in which signal lines for driving the subpixels SP disposed around the hole area HA are disposed.

Here, the hole area HA and the first boundary area BA1 can be areas that are open such that the camera sensor is disposed therein. For example, in a situation in which the hole area HA and the first boundary area BA1 are open, the area in which a sensor unit of the camera sensor is disposed can be referred to as the hole area HA, while the area in which a bezel of the camera sensor is disposed can be referred to as the first boundary area BA1.

The second boundary area BA2 located around the hole area HA can be an area in which signal lines for driving the subpixels SP in the active area A/A are disposed. Since the hole area HA is located in the active area A/A, none of signal lines connected to specific subpixels SP located around the hole area HA can be located in the hole area HA. Accordingly, the second boundary area BA2 can be provided around the hole area HA, and display operation signal lines, such as gate lines GL and data line DL, can be disposed in the second boundary area BA2.

The hole area HA provided in the active area A/A can be a single area or a plurality of areas depending on the type, number, and the like of sensors disposed in the active area A/A.

For example, referring to EX 1 in FIG. 3, a single hole area HA can be disposed in the active area A/A of the display panel 110. The first boundary area BA1 and the second boundary area BA2 can be disposed around the hole area HA. In addition, the subpixels SP or the like can be disposed outside of the second boundary area BA2. For example, the outer circumference of the boundary area BA can be spaced apart from the outer circumference of the active area A/A.

In another example, referring to EX 2 in FIG. 3, two hole areas HA can be disposed in the active area A/A of the display panel 110. The first hole area HA1 and the second hole area HA2 can have the same shape and size, or as in EX 2, can have different shapes and sizes.

The first boundary area BA1, in which signal lines or the like for driving a sensor disposed in the first hole area HA1, can be located around the first hole area HA1. The second boundary area BA2, in which signal lines or the like for driving a sensor disposed in the second hole area HA2, can be located around the second hole area HA2.

The second boundary area BA2 can be located outside of the first boundary area BA1. In addition, the subpixels SP can be disposed in the remaining portions of the active area A/A, except for the hole area HA and the boundary area BA, to display images.

Accordingly, since none of the signal lines for driving the subpixel SP located around the hole area HA can be disposed in the hole area HA, such signal lines can be disposed in the boundary area BA located around the hole area HA and connected to the subpixels SP located outside of the boundary area BA.

Figure 4:
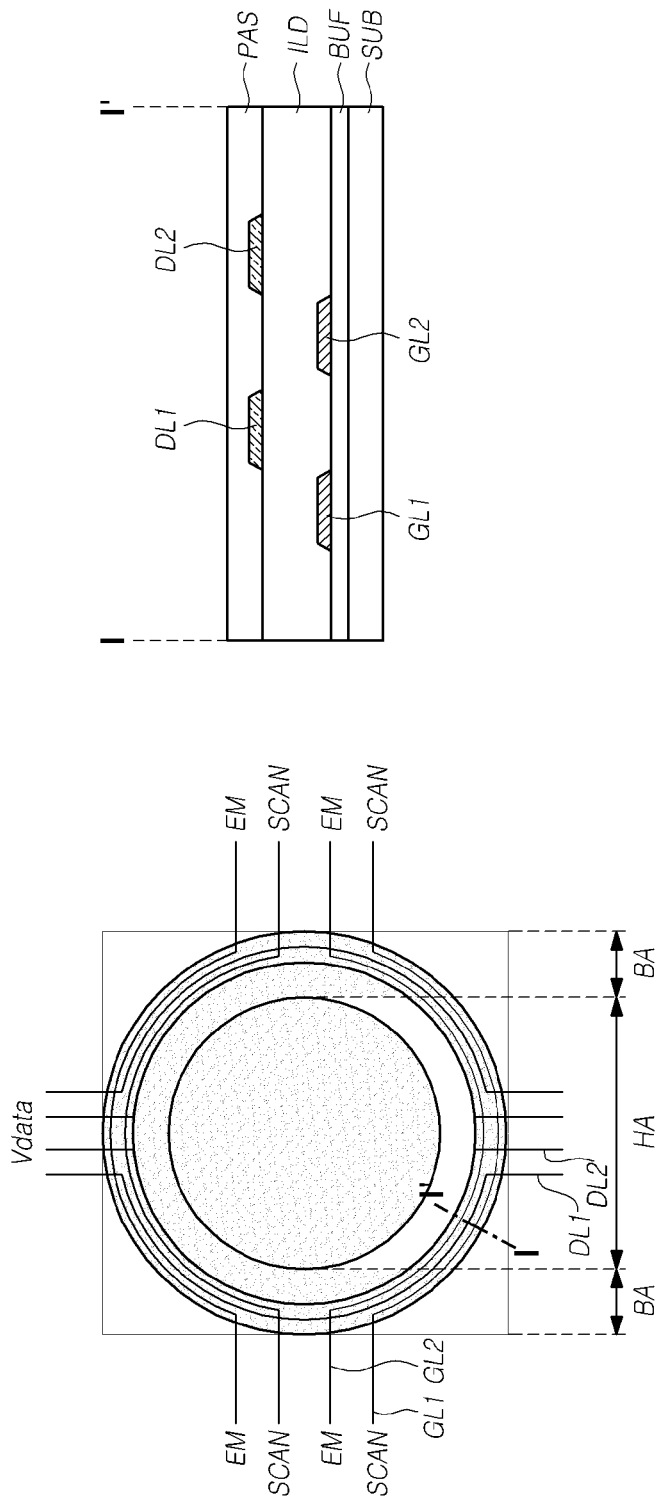
FIG. 4 illustrates a structure in which signal lines are disposed in a boundary area located around the hole area provided in the active area of the display device according to embodiments.

FIG. 4 illustrates a structure in which signal lines are disposed in the boundary area BA located around the hole area HA provided in the active area A/A of the display device 100 according to embodiments.

Referring to FIG. 4, gate lines GL can be disposed in one direction in the active area A/A of the display panel 110, and data lines DL can be disposed in a direction intersecting the gate lines GL.

In addition, in a case in which the hole area HA is located in the active area A/A, signal lines, such as the gate lines GL and the data line DL, can be disposed to pass through the boundary area BA located around the hole area HA.

For example, the gate lines GL through which the scan signal is applied can be disposed in the boundary area BA located around the hole area HA. The gate lines GL can be disposed in the boundary area BA, in a shape curved along the outer circumferential shape of the hole area HA. In addition, a portion of each of the gate lines GL extending outward from the boundary area BA can have a bent shape.

For example, each of the gate lines GL disposed in the boundary area BA can have a curved shape, with the bent portion being connected to the subpixel SP while maintaining a constant distance from the other gate lines GL.

In addition, the data lines DL through which the data voltage Vdata is applied can be disposed in the boundary area BA located around the hole area HA. The data lines DL disposed in the boundary area BA can also have a curved shape. In addition, a portion of each of the data lines DL extending outward from the boundary area BA can have a bent shape.

The gate lines GL and the data lines DL as described above can be disposed on different layers in the display panel 110.

For example, referring to the schematic cross-sectional structure of a portion I-I' in FIG. 4, a buffer layer BUF or the like can be disposed on a substrate SUB, and the gate lines GL can be disposed on the buffer layer BUF. An insulating layer ILD can be disposed on the gate lines GL, and the data lines DL can be disposed on the insulating layer ILD. In addition, a passivation layer PAS can be disposed on the data lines DL.

Since the gate lines GL and the data lines DL are disposed on different layers and are curved in the boundary area BA, the gate lines GL and the data lines can be connected to the subpixels SP located outside of the hole area HA.

Since the gate lines GL and the data lines DL are disposed along the outer circumference of the hole area HA in the boundary area BA, the gate lines GL and the data lines DL can be longer than the other signal lines disposed outside of the boundary area BA. In addition, the increased length of the signal lines can increase the load of the signal lines. In particular, the increased load of the data lines DL supplying the data voltage Vdata can cause the luminance of the subpixel SP to be lowered.

Embodiments provide a solution able to prevent degradations in the quality of an image displayed around the hole area HA while the hole area HA in which sensors or the like can be disposed therein is included in the active area A/A.

Figure 5:
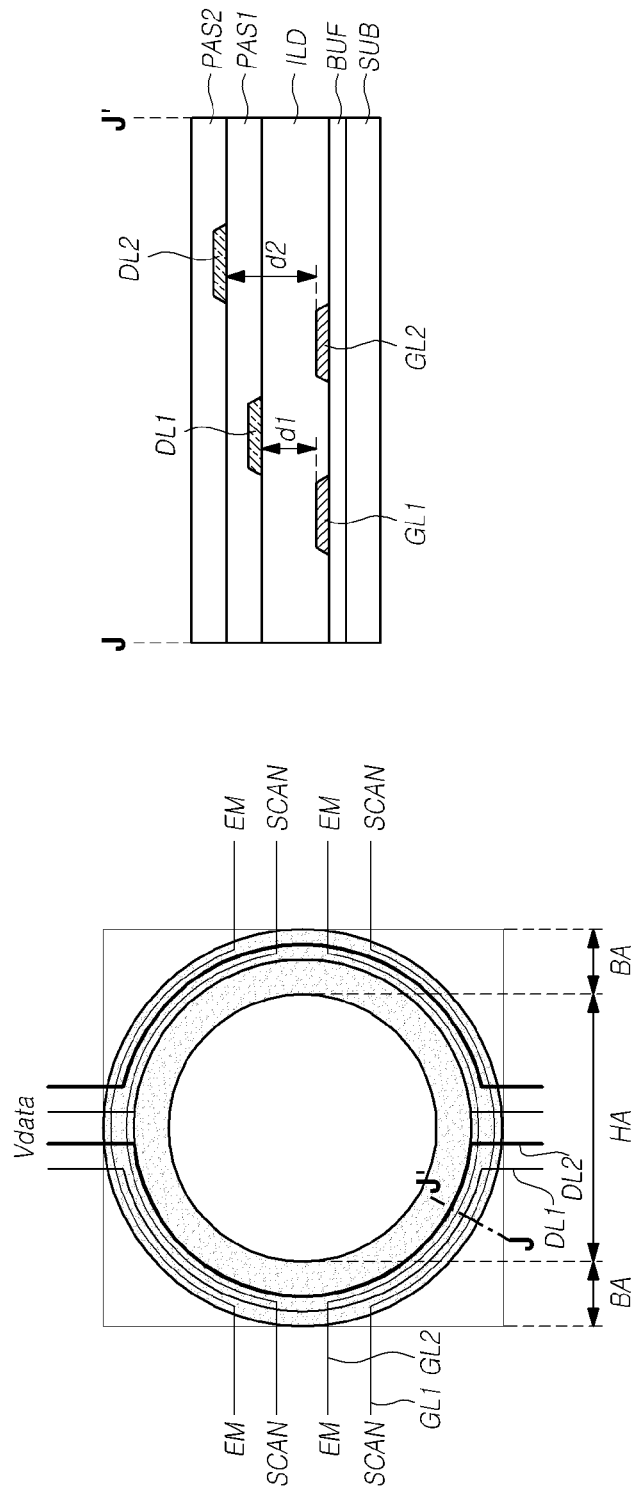
FIG. 5 illustrates another structure in which signal lines are disposed in a boundary area located around the hole area provided in the active area of the display device according to embodiments.

FIG. 5 illustrates another structure in which signal lines are disposed in the boundary area BA located around the hole area HA provided in the active area A/A of the display device 100 according to embodiments.

Referring to FIG. 5, the hole area HA in which the sensors or the like are disposed can be located in the active area A/A of the display panel 110. The boundary area BA can be located around the hole area HA while being in contact with the outer circumference of the hole area HA.

The gate lines GL, the data lines DL, and the like for driving subpixels SP located around the hole area HA can be disposed in the boundary area BA.

For example, the gate lines GL through which the scan signal is applied can be disposed in one direction while respectively including a curved portion and a bent portion in the boundary area BA. In addition, the data lines DL through which the data voltage Vdata is supplied can be disposed in a direction intersecting the gate lines GL while respectively including a curved portion and a bent portion in the boundary area BA.

Here, specific data lines DL among the plurality of data lines DL disposed in the boundary area BA can be disposed on different layers.

Referring to the schematic cross-sectional structure of a portion J-J' in FIG. 5, the insulating layer ILD can be disposed on the gate lines GL, and first data lines DL1 can be disposed on the insulating layer ILD. A first passivation layer PAS1 can be disposed on the first data lines DL1, and second data lines DL2 can be disposed on the first passivation layer PAS1. In addition, a second passivation layer PAS2 can be disposed on the second data lines DL2.

Here, the first data lines DL1 and the second data lines DL2 can be made of the same material.

In addition, since the second data lines DL2 are located above the first data lines DL1, a vertical distance d2 between the second data lines DL2 and the gate lines GL can be greater than a vertical distance d1 between the first data lines DL1 and the gate lines GL.

With an increase in the distance between the second data lines DL2 and the gate lines GL located below the second data lines DL2, parasitic capacitance that can be generated between the second data lines DL2 and the gate lines GL can be reduced, and the load of the second data lines DL2 can be reduced.

For example, embodiments can increase the distance between specific data lines DL among the plurality of data lines DL, disposed in the boundary area BA located around the hole area HA, and signal lines, such as the gate lines GL, disposed on a layer different from a layer on which the data lines DL located, thereby preventing an increase in the load caused by an increase in the length of the data lines DL.

Accordingly, the luminance of the subpixels SP disposed in an area adjacent to the hole area HA can be prevented from being degraded by an increase in the load of the data lines DL, through which the data voltage Vdata is supplied to the subpixels SP.

In addition, the load of specific data lines DL, among the plurality of data lines DL, driving the subpixel SP having a significant influence on the luminance, can be reduced, thereby increasing the effect of improving the luminance of the surroundings of the hole area HA.

Figure 6:
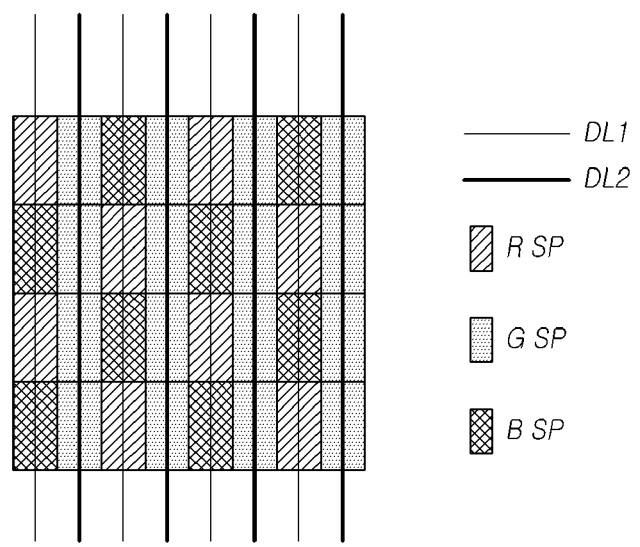
FIG. 6 illustrates an arrangement structure of data lines driving subpixels located around the hole area provided in the active area of the display device according to embodiments.

FIG. 6 illustrates an arrangement structure of the data lines DL driving the subpixels SP located around the hole area HA provided in the active area A/A of the display device 100 according to embodiments.

Referring to FIG. 6, red subpixels R SP, green subpixels G SP, and blue subpixels B SP can be disposed in the active area A/A of the display panel 110. Here, the red subpixels R SP and the blue subpixels B SP can be disposed to alternate with each other so as to be driven by the first data lines DL1. In addition, the green subpixels G SP can be disposed on the same columns so as to be driven by the second data lines DL2.

The peak wavelength of light emitted by the green subpixels G SP can be smaller than the peak wavelength of light emitted by the red subpixels R SP and greater than the peak wavelength of light emitted by the blue subpixels B SP. In addition, the luminance can be changed by the intensity of light emitted by the green subpixels G SP.

Accordingly, the second data lines DL2 driving the green subpixels G SP can be disposed on a layer above the first data lines DL1 driving the red subpixels R SP and the blue subpixels B SP to reduce the load of the second data lines DL2 and increase the luminance of the area driven by the corresponding data lines DL.

As described above, in the structure in which the signal lines driving the subpixels SP located around the hole area HA can be disposed in the boundary area BA and connected to the subpixels SP, a layer on which specific signal lines are disposed can be adjusted, thereby preventing the image quality from being degraded by an increase in the load.

In addition, the above-described arranged structure of the data lines DL can be applied to a case in which a plurality of hole areas HA are disposed in the active area A/A of the display panel 110.

Figure 7:
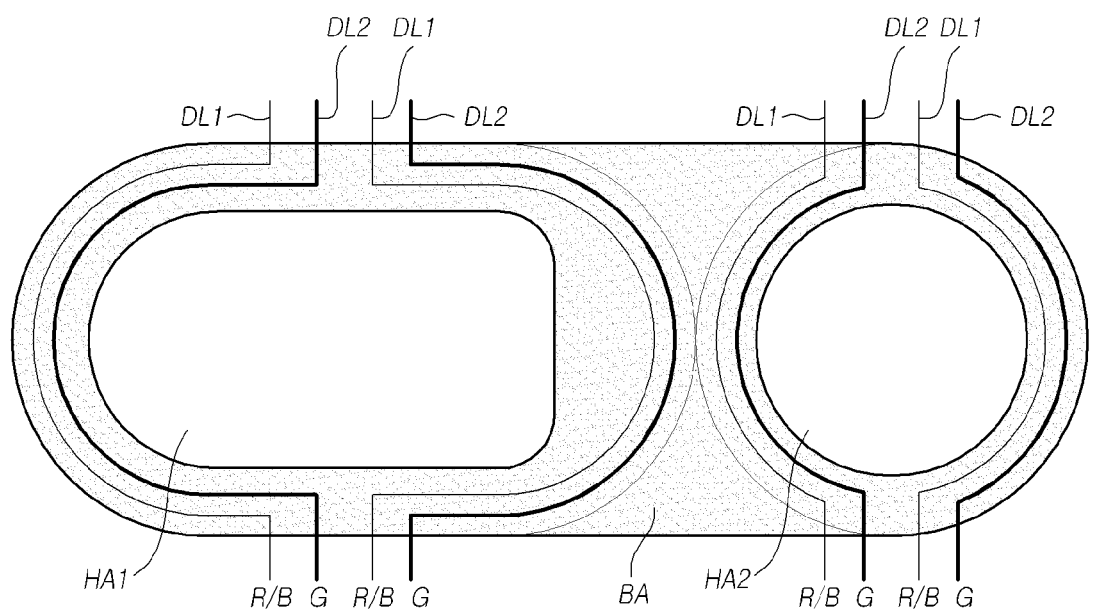
FIG. 7 illustrates another structure in which data lines are disposed in the boundary area located around the hole area provided in the active area of the display device according to embodiments.

FIG. 7 illustrates another structure in which the data lines DL are disposed in the boundary area BA located around the hole area HA provided in the active area A/A of the display device 100 according to embodiments.

Referring to FIG. 7, the first hole area HA1 and the second hole area HA2 can be disposed in the active area A/A.

The boundary area BA can be disposed around the first hole area HA1 and the second hole area HA2 to be in contact with the outer circumference of the first hole area HA1 and the outer circumference of the second hole area HA2. In the boundary area BA, the gate lines GL connected to the subpixels SP located on one side (e.g., to the left) and the other side (e.g., to the right) of the hole area HA can be disposed.

In addition, in the boundary area BA, the data lines DL connected to the subpixels SP located on one side of (e.g., above) and the other side of (e.g., below) the hole area HA can be disposed.

A part of each of the data lines DL disposed in the boundary area BA can include a portion having a curved shape. In addition, a part of each of the data line DL extending outward from the boundary area BA can include a portion having a bent shape.

Here, the first data lines DL1 driving the red subpixels R SP and the blue subpixels B SP and the second data lines DL2 driving the green subpixels G SP can be disposed to alternate with each other. In the addition, the second data lines DL2 can be disposed on a layer above the first data lines DL1.

This consequently increases the distance of the second data lines DL2 to the signal lines disposed on a layer below the data lines DL. In addition, increases in the distance of the second data lines DL2 to the signal lines disposed on the layer below the data lines DL can reduce the load of the second data lines DL2.

Accordingly, the load can be prevented from being increased by the increased length of the second data lines DL2 disposed in the boundary area BA, thereby preventing the luminance of the subpixels SP driven by the second data lines DL2 from being lowered.

In addition, the first data lines DL1 and the second data lines DL2 can be disposed in a predetermined pattern in a specific area, e.g., an area outside of the boundary area BA or a portion of the boundary area BA between the hole areas HA1 and HA2, for the purpose of uniform luminance or the ease of the arrangement of the signal lines.

Figure 8:
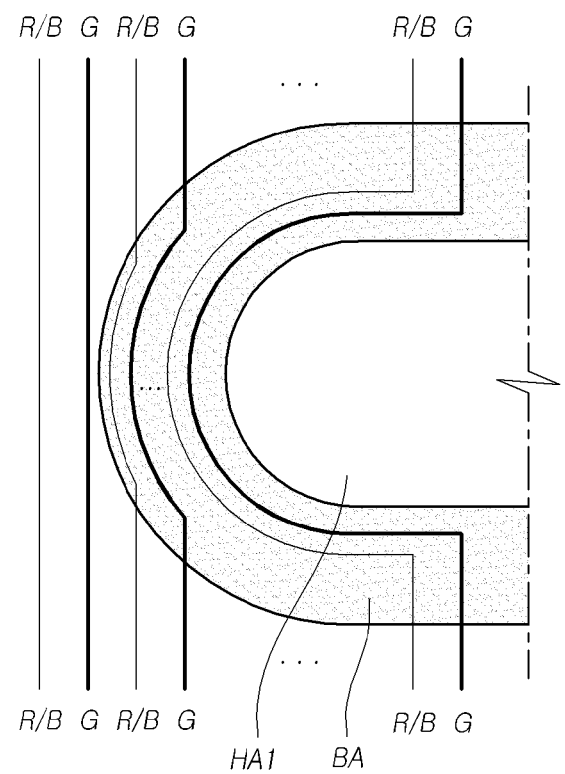
FIG. 8 illustrates a structure in which data lines are disposed outside and inside of the boundary area located around the hole area illustrated in FIG. 7.

FIG. 8 illustrates a structure in which the data lines DL are disposed outside and inside of the boundary area BA located around the hole area HA illustrated in FIG. 7.

Referring to FIG. 8, an example structure of the data lines DL disposed in the boundary area BA located to the left of the first hole area HA1 and in a portion of the active area A/A outside of the boundary area BA is illustrated.

The data lines DL connected to the subpixels SP disposed above the first hole area HA1 and the subpixels SP disposed below the first hole area HA1 can be disposed to bypass the first hole area HA1. The length of the curved portions of the data lines DL can increase when closer to the outer circumference of the first hole area HA1. In addition, the length of the curved portions of the data lines DL can decrease when closer to the outer circumference of the boundary area BA.

Here, although the distance between the curved portions of the data lines DL can be reduced due to the width of the boundary area BA, the distance between the linear portions of the data lines DL disposed outside of the boundary area BA can be constant.

Accordingly, the data lines DL can be disposed in the boundary area BA with the structure bypassing the hole area HA and be connected to the subpixels SP disposed above and below the hole area HA to drive the corresponding subpixels SP.

In addition, since the second data lines DL2 driving the green subpixels G SP are disposed on the upper layer, the load of the second data lines DL2, through which the data voltage Vdata is supplied to the green subpixels G SP, can be reduced, thereby preventing a decrease in the luminance of the area driven by the data lines DL, portions of which are disposed in the boundary area BA.

In addition, for the ease of the arrangement of the signal lines, the data lines DL disposed outside of the boundary area BA can be disposed in the same pattern as the data lines DL disposed in the boundary area BA. For example, the first data lines DL1 and the second data line DL2 located outside of the boundary area BA can be disposed on different layers.

Accordingly, the display device 100 according to embodiments can provide an arrangement structure in which the two data lines DL disposed adjacent to each other are disposed on different layers.

Figure 9:
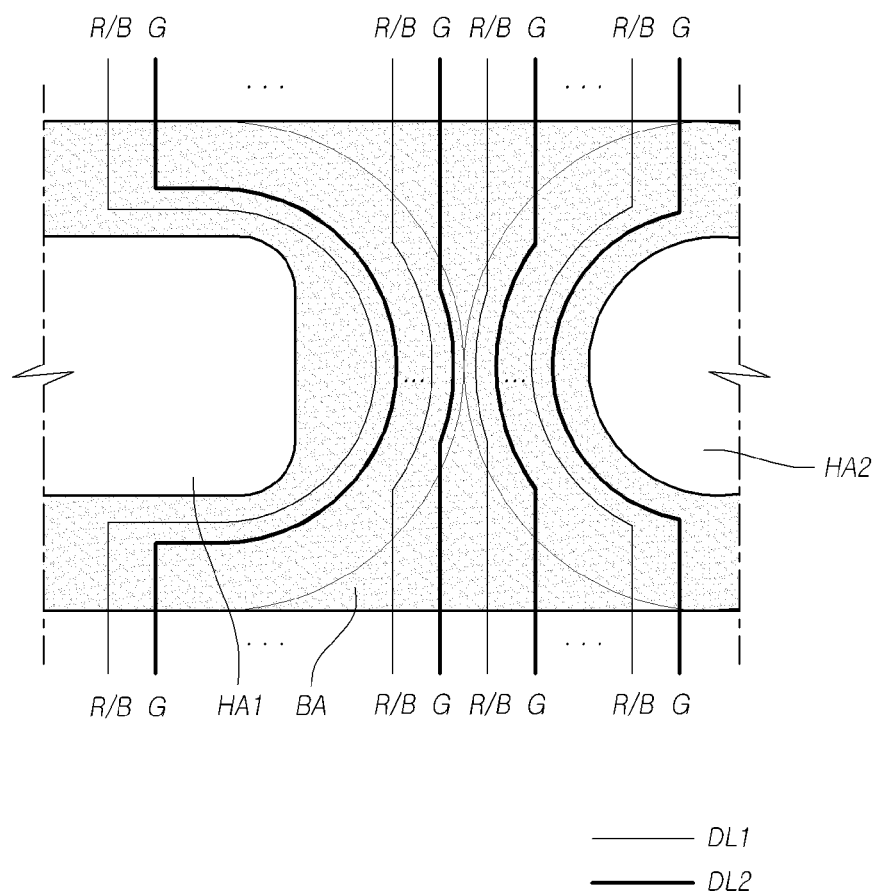
FIG. 9 illustrates a structure in which data lines are disposed in the boundary area located between two hole areas.

FIG. 9 illustrates a structure in which the data lines DL are disposed in the boundary area BA located between two hole areas HA.

Referring to FIG. 9, an example structure in which the data lines DL are disposed in the boundary area BA located between the first hole area HA1 and the second hole area HA2 is illustrated.

In the area between the first hole area HA1 and the second hole area HA2, specific data lines DL can have a shape curved along the outer circumferential shape of the first hole area HA1, while the other data lines DL can have a shape curved along the outer circumferential shape of the second hole area HA2. Thus, the data lines DL curved in the opposite directions can be disposed in the boundary area BA located between the first hole area HA1 and the second hole area HA2.

The data lines DL can be disposed with a curved shape in the boundary area BA between the first hole area HA1 and the second hole area HA2, such that the distance between the data lines DL can be reduced in the boundary area BA. In addition, the linear portions of the data lines DL extending outward from the boundary area BA can be connected to the subpixels SP located outside of the boundary area BA while having a constant distance.

Here, in the boundary area BA between the first hole area HA1 and the second hole area HA2, two adjacent data lines DL can be curved in the opposite directions. In addition, since the first data lines DL1 and the second data lines DL2 are disposed to alternate with each other, the adjacent data lines DL curved in the opposite directions can be disposed on different layers.

As described above, the display device 100 according to embodiments provides the structure including the hole area HA in the active area A/A, thereby allowing the sensors to be disposed in the active area A/A. In addition, the structure in which the signal lines for display operation are disposed in the boundary area BA located outside of the hole area HA is provided, thereby providing a structure of signal lines able to drive the subpixels SP located around the hole area HA.

In addition, the layer on which the data lines DL driving the subpixels SP exhibiting a specific color are disposed can be adjusted to reduce the load of the data lines DL, so that an increase in the load due to the data lines DL disposed to bypass the hole area HA can be reduced, and the uniformity of luminance occurring around the hole area HA can be improved.

Figure 10:
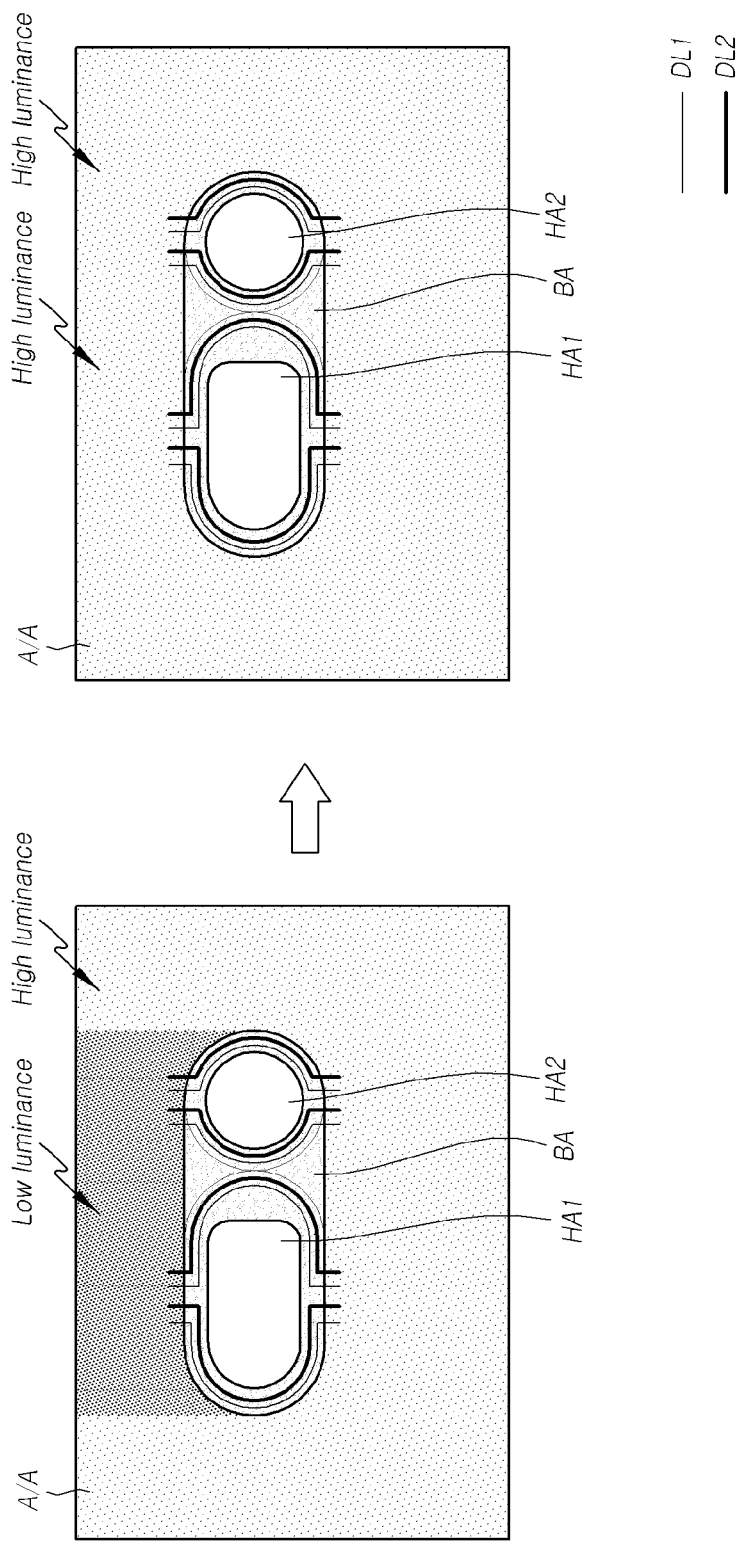

FIGS. 10 and 11 illustrate examples in which the uniformity of luminance in the active area A/A is improved by the arrangement structure of the data lines DL illustrated in FIG. 7.

Referring to FIG. 10, an example situation in which the data driver 130 supplying the data voltage Vdata to the data lines DL is located below the active area A/A. Since the data lines DL are disposed in the boundary area BA located around the hole area HA, with the load increasing with increases in the length, an area having low luminance, exhibited by the subpixels SP driven by the data lines DL, can occur.

For example, in a case in which the hole area HA, the boundary area BA, and the like are disposed at distances from the outer circumference of the active area A/A, specific subpixels SP can be driven by the data lines DL disposed in the boundary area BA between the hole area HA or the like and the outer circumference of the active area A/A.

In addition, since the data lines DL driving such subpixels SP are disposed in the boundary area BA, with the load thereof being increased, the area in which the subpixels SP driven by the corresponding data lines DL can have low luminance.

According to embodiments, the second data lines DL2 driving the green subpixels G SP, among the data lines DL disposed in the boundary area BA, can be located on the layer capable of reducing the load of the second data line DL2, thereby preventing a decrease in the luminance from occurring in the area located around the hole area HA.

In addition, even in a case in which the hole area HA is disposed adjacent to the outer circumference of the active area A/A, embodiments are applicable in a case in which the subpixels SP driven by the data lines DL disposed in the boundary area BA between the hole area HA and the outer circumference of the active area A/A are present.

For example, as illustrated in FIG. 11, the boundary area BA can be located around the hole area HA such that a portion of the boundary area BA is in contact with the outer circumference of the active area A/A.

In this case, when the outer circumference of the boundary area BA includes a curved portion, image-displaying subpixels SP can be disposed between the outer circumference of the boundary area BA and the outer circumference of the active area A/A. In addition, the data lines DL driving the corresponding subpixels SP can be disposed in the boundary area BA while bypassing the hole area HA.

Here, the second data lines DL2 driving the green subpixels G SP can be disposed on a layer different from the layer on which the first data lines DL1 driving the red subpixels R SP and the blue subpixels B SP are disposed, thereby preventing a decrease in the luminance that would otherwise be caused by an increase in the load of the data lines DL in the corresponding area.

According to embodiments as set forth above, a structure in which sensors can be disposed in the active area A/A can be provided by disposing the hole area HA in a portion of the active area A/A of the display panel 110.

In addition, embodiments can provide an arrangement structure of signal lines able to drive the subpixels SP located around the hole area HA by providing the boundary area BA outside of the hole area HA and allowing the display operation signal lines disposed in the boundary area BA to have a curved shape.

In addition, embodiments can provide a structure in which specific data lines DL driving the green subpixels G SP, among the data lines DL disposed in the boundary area BA to drive the subpixels SP located outside of the boundary area BA, are disposed on a layer different from the layer on which the other data lines DL are disposed.

Accordingly, a solution able to prevent an increase in the load of the data lines DL driving the green subpixels G SP, thereby preventing a decrease in the luminance of the subpixels SP driven by the corresponding data lines DL and reducing the non-uniformity of the luminance occurring around the hole area HA, can be provided.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. The above description and the accompanying drawings provide an example of the technical idea of the present invention for illustrative purposes only. For example, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:
1. A display device, comprising:
a display panel including a substrate on which an active area where a plurality of subpixels are disposed is defined;
at least one hole area surrounded by the active area;
a boundary area disposed between the at least one hole area and the active area;
at least one gate line to supply a scan signal or an emission signal to a first group of subpixels among the plurality of subpixels;
a first data line disposed on the active area and the boundary area, the first data line being configured to supply first data voltages to a second group of subpixels including at least one first color subpixel and at least one second color subpixel among the plurality of subpixels, the second group not including any green subpixels; and
a second data line disposed on the active area and the boundary area, the second data line being configured to supply a second data voltage to a third group of subpixels including at least one green subpixel different from the first and second color subpixels among the plurality of subpixels,
wherein in the boundary area, a vertical distance of the second data line from the substrate is different from a vertical distance of the first data line from the substrate, to reduce a load of the second data line to prevent a decrease of luminance in an area located around the at least one hole area.

2. The display device of claim 1, wherein the second group of subpixels is included in the first group of subpixels, the third group of subpixels is included in the first group of subpixels, and the second group of subpixels is different from the third group of subpixels.

3. The display device of claim 1, wherein the first group of subpixels includes a red subpixel, a green subpixel and a blue subpixel.

4. The display device of claim 1, wherein the second group of subpixels includes a red subpixel and a blue subpixel, and does not include a green subpixel.

5. The display device of claim 4, wherein the third group of subpixels includes the green subpixel, and does not include the red subpixel and the blue subpixel.

6. The display device of claim 5, further comprising:
an insulating layer disposed between the at least one gate line and the first data line; and
a passivation layer disposed between the first data line and the second data line,
wherein a thickness of the insulating layer is greater than a thickness of the passivation layer.

7. The display device of claim 1, wherein the at least one gate line includes:
a first gate line disposed on the active area and the boundary area, and configured to supply the scan signal to the first group of subpixels; and
a second gate line disposed on the active area and the boundary area, and configured to supply the emission signal to the first group of subpixels,
wherein the first gate line is one of a plurality of first gate lines,
wherein the second gate line is one of a plurality of second gate lines, and
wherein the plurality of first gate lines and the plurality of second gate lines are arranged in an alternating manner in one direction.

8. The display device of claim 7, wherein the first data line is one of a plurality of first data lines,
wherein the second data line is one of a plurality of second data lines, and
wherein the plurality of first data lines and the plurality of second data lines are arranged in an alternating manner in another direction crossing the one direction.

9. The display device of claim 7, wherein the first data line and the second data line overlap with both of the first gate line and the second gate line.

10. The display device of claim 7, wherein the first data line and the second data line cross over both of the first gate line and the second gate line at the boundary area.

11. The display device of claim 7, wherein each of the first gate line, the second gate line, the first data line and the second data line includes a curved portion and a straight portion, and
wherein a curved portion of the first gate line crosses over a straight portion of the first data line, or a straight portion of the first gate line crosses over a curved portion of the first data line.

12. The display device of claim 7, wherein the boundary area includes a first boundary area surrounding the hole area, and a second boundary area surrounding the first boundary area, and
wherein the first gate line, the second gate line, the first data line and the second data line are disposed on the second boundary area and are not included in the first boundary area.

13. The display device of claim 12, wherein the hole area and the first boundary area are areas that are open and configured to receive a sensor unit.

14. The display device of claim 13, wherein the first boundary area includes signal lines for driving the sensor unit.

15. The display device of claim 7, wherein a vertical distance between the second data line and the first gate line is greater than a vertical distance between the first data line and the first gate line.

16. The display device of claim 7, wherein the first gate line and the second gate line are disposed on a same layer.

17. The display device of claim 1, wherein the first data line is connected to a plurality of red subpixels and a plurality of blue subpixels, and
wherein the second data line is connected to a plurality of green subpixels.

18. The display device of claim 1, wherein the second group of subpixels emits a different color than the first group of subpixels.

19. The display device of claim 1, wherein the first data line and the second data line are disposed in different layers.

20. The display device of claim 1, wherein the second data line is one of a plurality of second data lines, and
wherein two adjacent second data lines among the plurality of second data include curved portions that curve towards each other.

* * * * *